(12) United States Patent
Schettine

(10) Patent No.: US 7,444,270 B2
(45) Date of Patent: *Oct. 28, 2008

(54) METHOD, APPARATUS AND BANNER FOR STRUCTURE LAYOUT

(76) Inventor: Michael Schettine, 1077 Youngs Rd., Delanson, NY (US) 12053

( * ) Notice: Subject to any disclaimer, the term of this patent is extended or adjusted under 35 U.S.C. 154(b) by 645 days.

This patent is subject to a terminal disclaimer.

(21) Appl. No.: 10/894,590

(22) Filed: Jul. 20, 2004

(65) Prior Publication Data

US 2005/0004784 A1 Jan. 6, 2005

Related U.S. Application Data

(63) Continuation-in-part of application No. 09/551,681, filed on Apr. 18, 2000, now Pat. No. 6,766,282.

(51) Int. Cl.
*G06F 17/50* (2006.01)
*E04B 1/00* (2006.01)
(52) U.S. Cl. .................. 703/1; 52/741.1; 52/745.09
(58) Field of Classification Search .............. 703/1; 52/741.05, 741.1, 90.1, 745.09
See application file for complete search history.

(56) References Cited

U.S. PATENT DOCUMENTS

| | | | |
|---|---|---|---|
| 3,628,232 A | 12/1971 | Brewer | 29/407.1 |
| 3,785,060 A | 1/1974 | Brewer | 33/549 |
| 3,816,931 A | 6/1974 | LaMar | 33/563 |
| 4,367,590 A | 1/1983 | Winter et al. | 33/758 |
| 4,845,858 A | 7/1989 | Thomas | 33/759 |
| 5,195,249 A | 3/1993 | Jackson | 33/528 |
| 5,627,763 A | 5/1997 | Carlson | 703/1 |
| 5,640,812 A * | 6/1997 | Crowley et al. | 52/90.1 |
| 5,724,246 A | 3/1998 | Heil | 700/167 |
| 5,755,072 A | 5/1998 | Lingafelter | 52/741.1 |
| 5,819,498 A | 10/1998 | Geraci | 52/745.1 |

OTHER PUBLICATIONS

Langdon, Geoffrey Moore. "AutoCAD Architectural Desktop." Cadence Channel: Feature Review AutoCAD Architectural Desktop. Oct. 1998.*
Newton, C. Simulated Site Visits. A 4D Multimedia Database for the Study of Architectural Construction, 1999 IEEE International Conference on Information Visualization, pp. 62-66.
Boar, B.H. A Blueprint for Solving Problems in Your IT Architecture, IT Professional; vol. 1, Issue 6, Nov.-Dec. 1999, pp. 23-29.
Huang et al., M. Interpreting Images of Architectural Drawings for Building Cost Estimation, Sixth International Conference on Image Processing and Its Applications, vol. 1, 1997, pp. 126-130.

(Continued)

*Primary Examiner*—Russell Frejd
(74) *Attorney, Agent, or Firm*—Heslin Rothenberg Farley & Mesiti P.C.

(57) ABSTRACT

The present invention relates generally to structure layout and marking during construction. More particularly, the present invention relates to an automated layout system that acquires data directly from an architectural design, and generates a banner for denoting the precise location of building elements such as studs, doors, windows, etc., for a structure under construction.

20 Claims, 17 Drawing Sheets

OTHER PUBLICATIONS

Dosch et al., P. Reconstruction of the 3D Structure of a Building form the 2D Drawings of its Floors, Proceedings of the Fifth International Conference on Document Analysis and Recognition, ICDAR '99, 1999, pp. 487-490.

Ding et al., C. A. Framework for the Automated Drawing of Data Structure Diagrams, IEEE Transactions on Software Engineering, vol. 16, No. 5, May 1990, pp. 543-557.

* cited by examiner

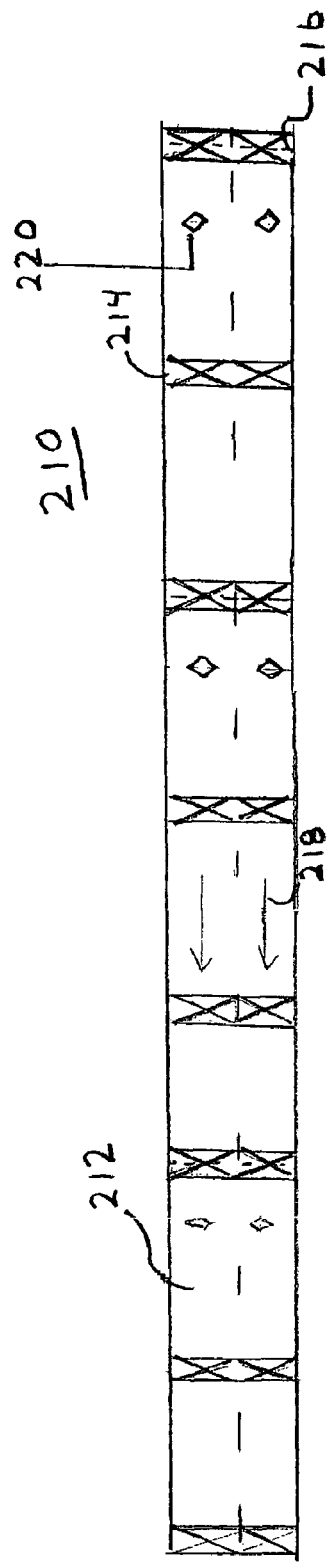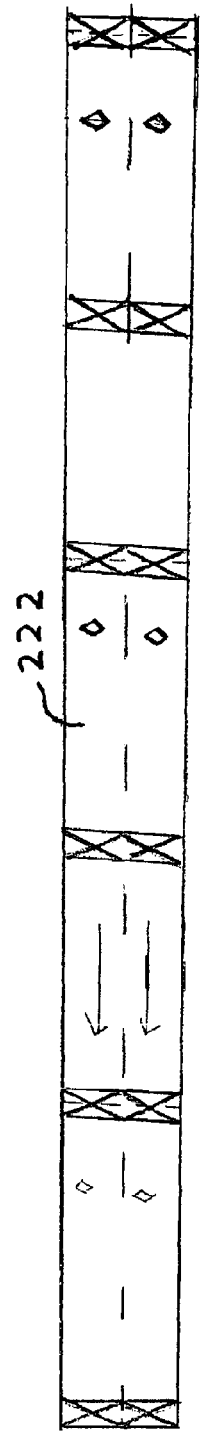
FIG. 23
FIG. 24

METHOD, APPARATUS AND BANNER FOR STRUCTURE LAYOUT

CROSS REFERENCE TO RELATED APPLICATION

This application is a continuation-in-part of application Ser. No. 09/551,681 filed Apr. 18, 2000, now U.S. Pat. No. 6,766,282, the entire contents of which is incorporated herein by reference.

FIELD OF THE INVENTION

The present invention relates generally to a structure layout and marking during construction. More particularly, the present invention relates to an automated layout system that acquires data directly from the architectural design e.g., drawing, blueprint, or CAD (computer aided design)) to generate a template to locate the building elements of a structure.

BACKGROUND OF THE INVENTION

Generally building construction includes framing. In platform framing, which is used for most residential construction, the first floor is built on top of the foundation walls as though it were a platform. The floor provides a base upon which the carpenter can assemble wall sections and then raise them into place. The wall sections may support a platform for the second floor where the wall sections and partitions are again built and erected. Each floor is framed separately. The roof is framed above the upper walls.

Typically, a carpenter must read a building blueprint to determine the dimensions for each wall. The carpenter then uses a flexible measuring tape to make manual measurements of distances along a structural member such as a top or bottom plate of a wall. Markings are manually applied to the structural member to locate the positions of various members such as studs, jack posts, cripples, etc. Additionally, the locations for doors and windows have to be manually marked.

The manual marking method is time consuming and requires a large number of measurements. The measurements may also require the assistance of another person. Measuring and marking errors may result in misplaced components such as doors or windows. These mistakes can result in costly construction delays involving reinstallation and rebuilding of structural elements.

SUMMARY OF THE INVENTION

The present invention provides an automated layout system that acquires data directly from the architectural design (e.g, drawing, blueprint, or CAD (computer aided design)). The automated layout system then generates a full size template, hereafter referred to as ~banner," for denoting the precise location of building components such as studs, doors, windows, etc., for a building under construction.

The present invention in one embodiment generally provides an apparatus comprising:

an input system for acquiring an architectural design of a structure;

a processing system for converting the architectural design into a plurality of component locations of the structure; and an output system for receiving at least one component location from the processing system and for outputting each component location as markings on a banner, the banner being sized to overlay a first surface of an elongated framing element of the structure, the elongated framing element having a rectangular cross section defined by said first surface, an opposite surface and two narrow side surfaces.

The architectural design may include an identification of a first component of the structure. This identification may comprise at least one of a (a) vendor part number for said first component and (b) dimensional measurements of the first component. The first component may comprise a door or a window, and the measurements may comprise rough opening dimensional measurements of the door or window. Alternatively, the processing system may determine dimensions of the first component by using the vendor part number to access a data base of vendor part specifications.

In another aspect, the architectural design may include a job site location metric, and the processing system may determine particular region engineering specifications for the structure by using this metric to access a data base of such specifications.

In another aspect, the structure may comprise a roof truss assembly, a gable end and/or a rafter assembly. When the structure is a roof truss assembly, the framing element may comprise a top chord or a bottom chord. When the structure comprises a gable end, the framing element may comprise at least one of a rafter and a bottom plate. When the structure comprises a roof top assembly, the framing element may comprise a rafter member and the at least one component location may comprise a location of at least one of (a) an end cut, (b) a bird's mouth cut, (c) a hip jack rafter, and (d) a valley jack rafter.

The present invention provides a method comprising the steps of:

providing an architectural design of a framing structure;

with a computer aided design system, generating a digitized data file from the architectural design;

with a processing system, converting the digitized data file into a plurality of component locations of the structure; and marking the location for at least one component onto at least one banner, the banner being sized to overlay a first surface of an elongated reference component of the framing structure, the reference component having a rectangular cross section defined by the first surface, an opposite surface and a pair of narrower side surfaces; and applying a gasket to said banner.

The banner may be oversized so that a portion of the banner extends beyond the first surface and the gasket is affixed to said portion. The banner may be attached onto the first surface of the reference component with the banner portion affixed to a side or end surface of the component.

The present invention also provides a banner sized to overlay an elongated framing element of a building structure, comprising:

an elongated sheet of material; and a plurality of uniformly spaced markings on the elongated sheet of material for indicating a location for at least one component of the structure, these markings including junction set back markings. The markings may also include stud location markings, and at least one of wall board location markings and directional markings.

In another aspect, a banner sized to overlay an elongated framing element of the building structure comprises:

an elongated sheet of material; and a plurality of markings on the elongated sheet of material for indicating a location for at least one component of the structure, and the structure comprises a roof truss assembly, a gable end, and/or a rafter assembly.

In a further aspect, a weatherproofing gasket may be affixed to the sheet of material forming the banner, or the sheet of material may be comprised of printable weatherproofing gasket material.

BRIEF DESCRIPTION OF THE DRAWINGS

The features of the present invention will best be understood from a detailed description of the invention and a preferred embodiment thereof selected for the purposes of illustration and shown in the accompanying drawings in which:

FIG. 23 illustrates a plan view of a first side of a generic banner; and

FIG. 24 illustrates a plan view of a reverse side of the generic banner of FIG. 23.

DETAILED DESCRIPTION OF THE INVENTION

Figure 1:
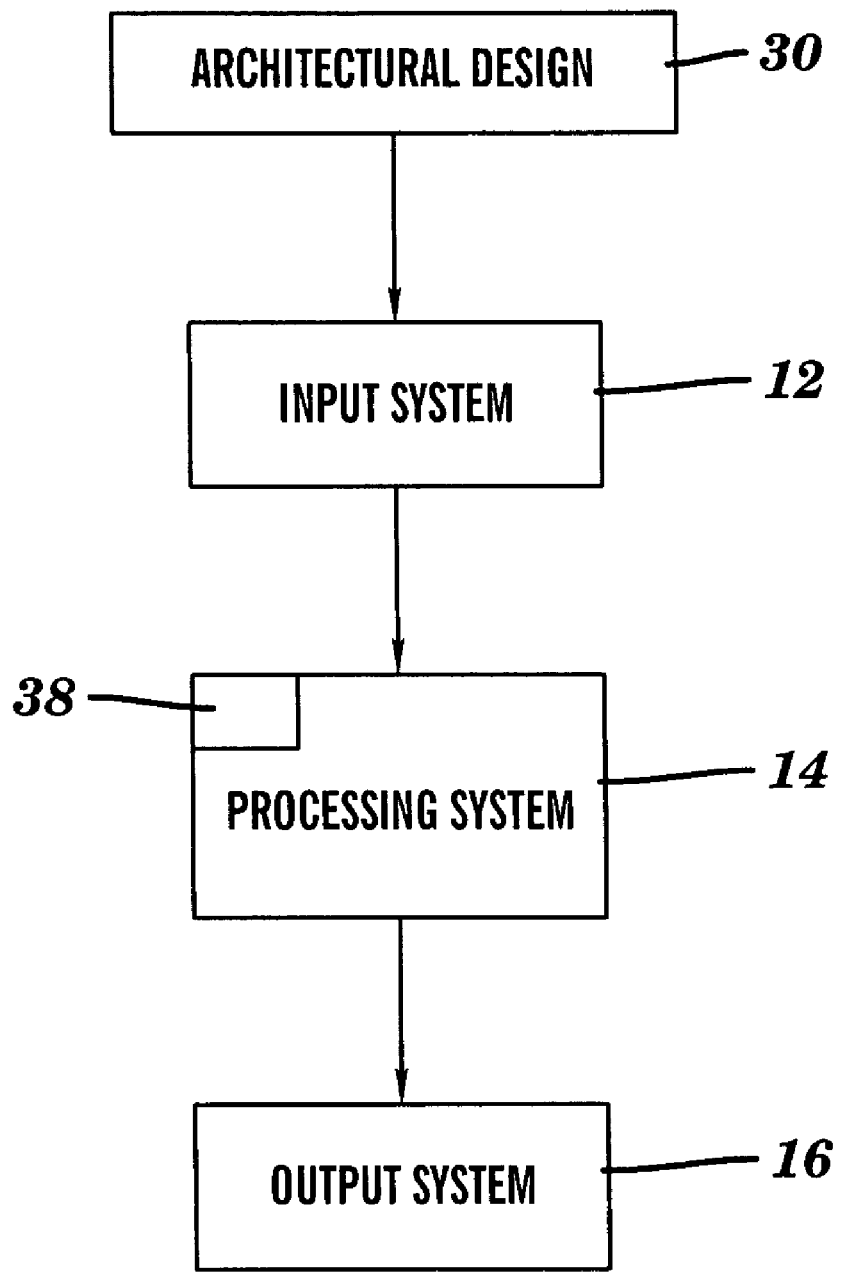
FIG. 1 illustrates a schematic apparatus view of an automated layout system.

Although certain preferred embodiments of the present invention will be shown and described in detail, it should be understood that various changes and modifications may be made without departing from the scope of the appended claims. The scope of the present invention will in no way be limited to the number of constituting components, the materials thereof, the shapes thereof, the relative arrangement thereof, etc., which are disclosed simply as an example of the preferred embodiment. The features and advantages of the present invention are illustrated in detail in the accompanying drawings, wherein like reference numerals refer to like elements throughout the drawings. Although the drawings are intended to illustrate the present invention, the drawings are not necessarily drawn to scale.

Figure 7:
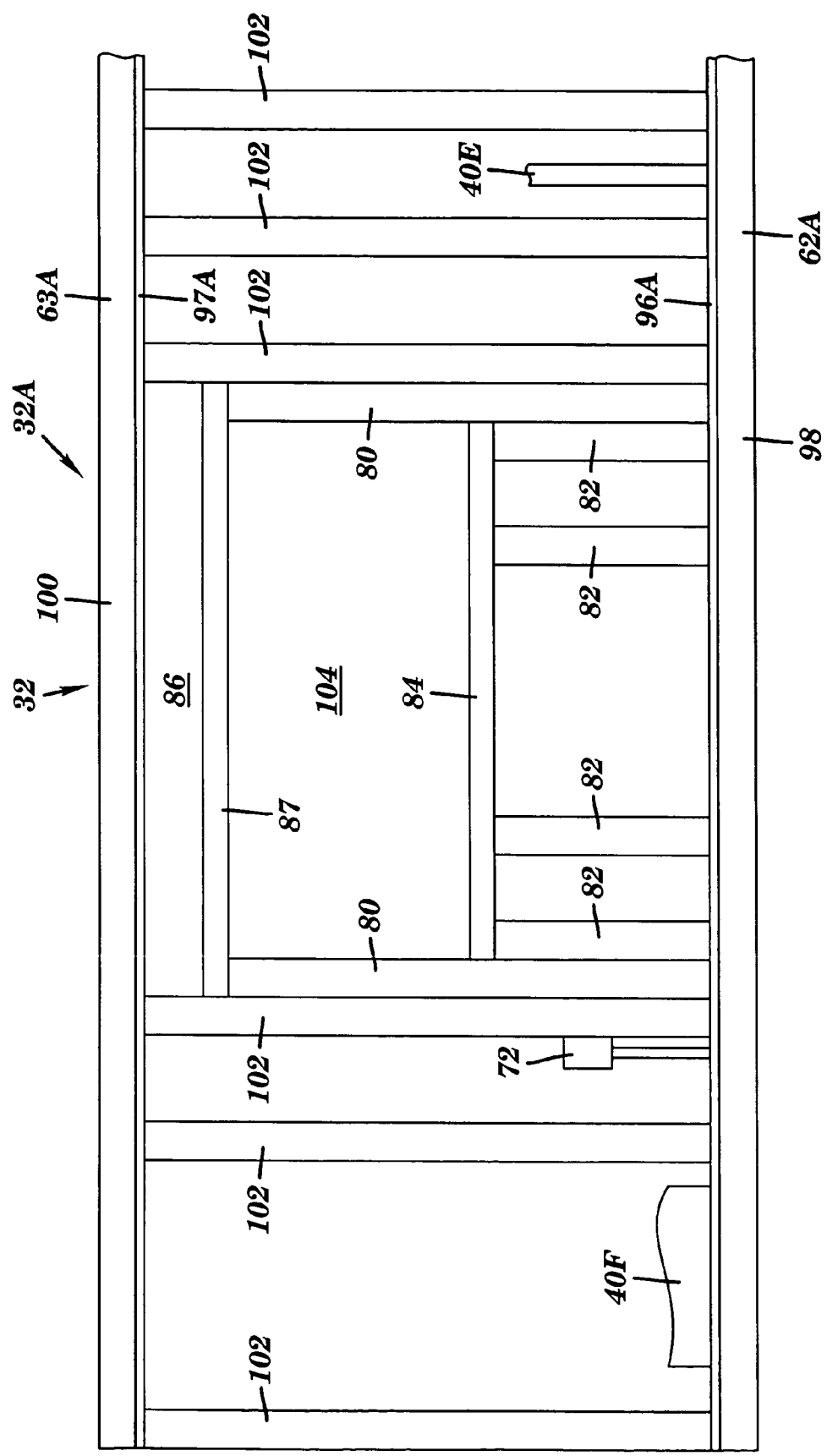
FIG. 7 illustrates a side view of a framed wall of the structure including an electrical component, a plumbing component, a heating, ventilation, or air conditioning component, and a window opening.

FIG. 1 illustrates a schematic apparatus view of an automated layout system 10. The automated layout system 10 includes an input system 12, a processing system 14, and an output system 16. The input system 12 acquires an architectural design 30 of a structure 32 (FIG. 7).

Figure 2:
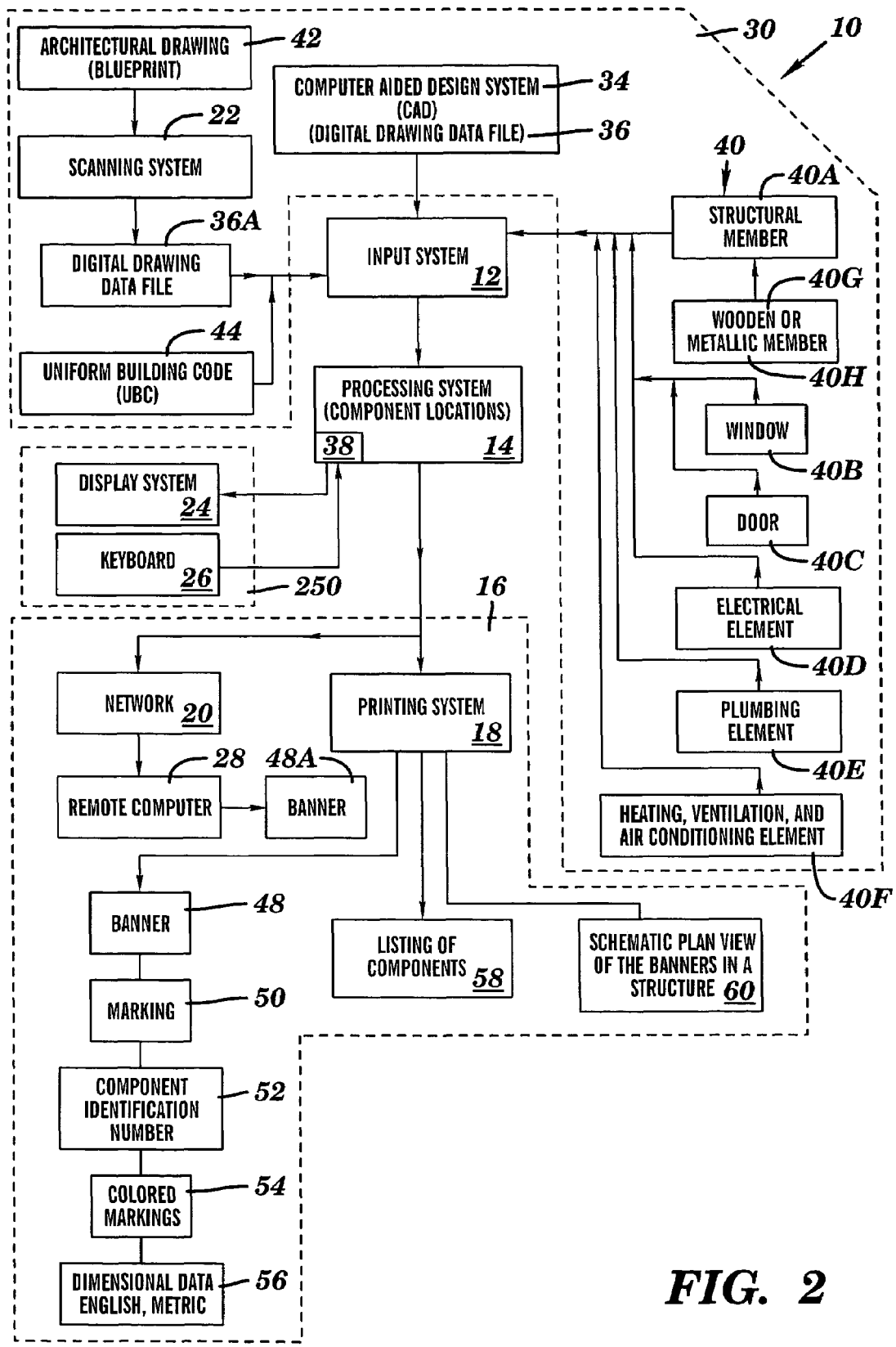
FIG. 2 illustrates a schematic view of a flow chart of the automated layout system.

FIG. 2 illustrates a schematic view of a flow chart of the automated layout system 10. A designer creates an architectural design 30 of a structure 32 (FIG. 7). The structure 32 may be, for example, a wall of a residential building, an office building, a warehouse, etc. The architectural design 30 may be generated using a Computer Aided Design System (CAD) 34. The CAD system 34 converts the architectural design 30 into a digital drawing data file 36. The digital drawing data file 36 is sent to the input system 12. From the input system 12 the digital drawing data file 36 is sent to the processing system 14. the processing system 14 may include a computer 38. The computer 38 may include a display system 24 (FIG. 1) for displaying information transmitted from the computer 38. The computer 38 may include any suitable device, for example, a keyboard 26 or mouse, for enabling an operator to send commands to the computer 38. The display system 24 and the keyboard 26 may be included in a workstation 250.

The architectural design 30 includes component 40 information. The component 40 information may include a structural member 40A, a window 40B, a door 40C, an electrical element 40D, a plumbing element 40E, and a heating, ventilation, air conditioning element 40F, etc. The structural member 40A may include a wooden member 40G a metallic member 40H, or other building material of the structure 32. The window 40B information, door 40C information and other component information may include not only the specific location of the component but also a particular component identification such as a vendor part or call out number, or actual rough opening dimensional measurements. Vendor part numbers may be used to access a data base of vendor part specifications in order to determine the dimensions of components. The component 40 information is transmitted through the input system 12 to the processing system 14.

The architectural design 30 may include an architectural drawing 42, such as a blueprint. The architectural drawing 42 may be fed through a scanning system 22. The scanning system 22 generates a digital drawing data file 36A that is transmitted through the input system 12 into the processing system 14.

The architectural design 30 may include Uniform Building Code (UBC) or International Residential Code (IRC) or other building code 44 data that is transmitted through the input system 12 into the processing system 14. The UBC 44 data contains local building code standards that a structure must meet. These standards include, for example, structural member 40A thickness dimensions and spacings.

The architectural design 30 may also include a building site area code number or other job site location metric which can be used to identify and access particular region engineering specifications for the structure. Such specifications may be stored in a data base associated with input system 12 and/or processing system 14.

The processing system 14 combines the component 40 information, the digital drawing data file 36, 36A, and the code 44 data. The processing system 14 calculates and generates the dimensional location for each of the component 40 (e.g., structural member 40A, window 40B, door 40C, electrical element 40D, plumbing element 40E, heating, ventilation, air conditioning element 40F, etc.) within the structure 32. The dimensional location of each component 40 is digitized and automatically transferred to the output system 16.

The output system 16 may send the digitized dimensional location of each component 40 to a network 20. The network 20 may be, e.g., an internet connection, a computer network, etc. The network 20 may transmit digitized dimensional location information for each component 40 to a remote computer system 28. The remote computer system 28 may be used to output a banner 48A. Additionally, the output system 16 may store the digitized location for each component 40 on any suitable storage media (e.g., hard disk, floppy disk, tape, etc.). The storage media may then be transported and inserted into the remote computer system 28. The remote computer system 28 may be used to output the banner 48A.

The output system 16 sends the digitized dimensional location of each component 40 to the printing system 18. The printing system 18 prints a banner 48. The banner 48 is a full size template including a plurality of markings 50, a plurality of component identification numbers 52, colored markings 54, dimensional data 56 (e.g., English, Metric, etc.)and so on. The banner 48 may be made from any suitable durable waterproof sheet material, for example, TYVEK™ (DuPont), plastic, etc. The TYVEK™ includes spunbonded olefin fibres. The markings 50 show the location for each component 40 of the structure 32 on the banner 48. The markings may be uniformly spaced, for example, at 16 inch intervals to indicate stud spacing. The markings 50 may be colored markings 54 to indicate a component type, such as black for the structural member 40A, red for the electrical element 40D, blue for the plumbing element 40E, and green for the heating, ventilation, and air conditioning element 40F. Identification numbers 52 (e.g., vendor part numbers) may be printed on the banner 48 adjacent to the location of the component such as a window 40B or a door 40C. Dimensional data 56 for structural member 40A lengths may be printed on the banner 48. The dimensional data 56 may be printed in any suitable standard (e.g., English, Metric, etc.). One or more different types of the markings 50 may be pre-printed on the sheet material forming the banner 48 (e.g., by the manufacture of the sheet material of the banner 48, by other manufacturers, or by a printing company, etc.) prior to the banner 48 being printed by the printing system 18. For example, indicia, such as uniformly spaced lines arranged 16" on center, may be pre-printed on the sheet material forming the banner 48. The banner is preferably sized to overlay a first broader surface of an elongated framing element but may be sized and/or placed on a narrower side surface of the element.

The printing system 18 may print a listing of components 58. The listing of components 58 includes a printout of all of the components 40 in a structure 32 for each banner 48 within the structure 32. The printing system 18 may print a schematic plan view 60 of the banner 48 locations within the structure 32.

Figure 3:
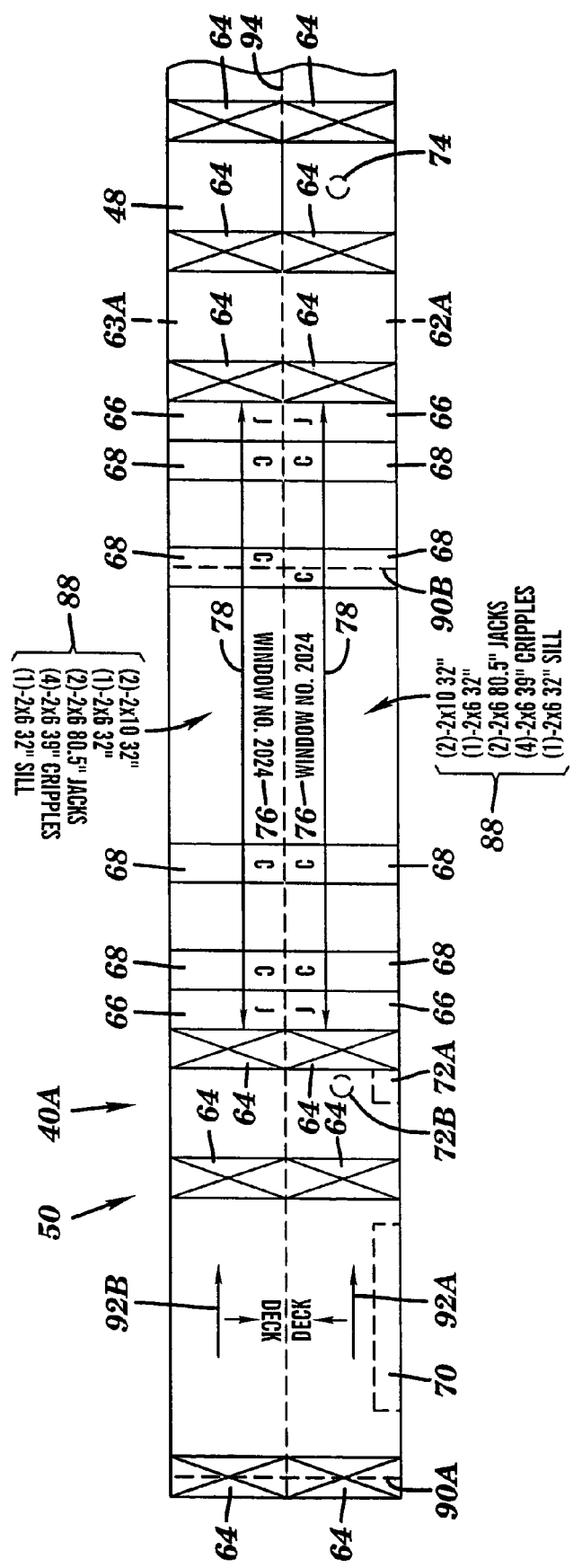
FIG. 3 illustrates a plan view of a banner attached to a first reference component and a second reference component of a structure.
Figure 4:
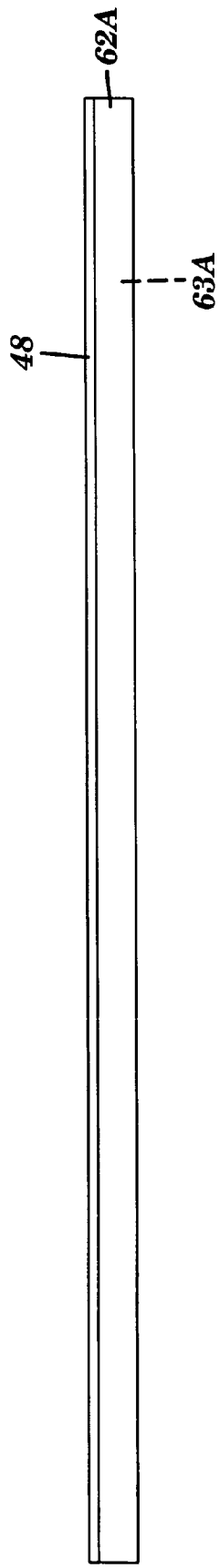
FIG. 4 illustrates a side view of the banner attached to the first reference component and the second reference component.
Figure 5:
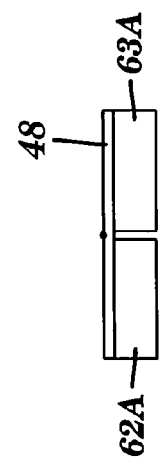
FIG. 5 illustrates an end view of the banner attached to the first reference component and the second reference component.

FIGS. 3, 4 and 5 illustrates the banner 48 attached to a first reference component 62A and a second reference component 63A of a structure 32A (FIG. 7). FIG. 3 illustrates a plan view of the banner 48 attached to the first reference component 62A and the second reference component 63A. FIG. 4 illustrates a side view of the banner 48 attached to the first reference component 62A and the second reference component 63A. FIG. 5 illustrates an end view of the banner 48 attached to the first reference component 62A and the second reference component 63A. The first reference component 62A is a bottom plate of the structure 32A and the second reference component 63A is a top plate of the structure 32A as illustrated in FIG. 7. The first reference component 62A and the second reference component 63A are placed adjacent to each other and the banner 48 is attached to the first reference component 62A and the second reference component 63A (FIGS. 3, 4, and 5). The markings 50 on the banner indicate the location of the components 40 such as structural members 40A, the window 40B, the electrical element 400, the plumbing element 40E, and the heating, ventilation, air conditioning element 40F, etc.

As illustrated in FIG. 3, the markings 50 for structural members 40A include a plurality of stud locations 64, a plurality of jack locations 66, and a plurality of cripple locations 68. Markings 50 include a location 70 for a heating, ventilation, and air conditioning element 40F. Markings 50 include a location 72A and a location 72B for the electrical element 400. Markings 50 include the location 174 for the plumbing element 40E. FIG. 3 illustrates an identification part number 76 for a window 40B that is printed on the banner 48. Marking 50 includes lines 78 for identifying the location for the window 40B. The lengths and the quantity of the structural members 40A including a plurality of jacks 80, a plurality of cripples 82, a sill 84, a plurality of headers 86, and a header sill 86 are printed 88 onto the banner 48. Markings 50 include dotted lines 90A and 90B spaced 4 feet apart to denote the location for a four foot wide wall board (not shown). Markings 50 include a cut line 94 that is cut by a sharp object such as a knife.

Figure 6:
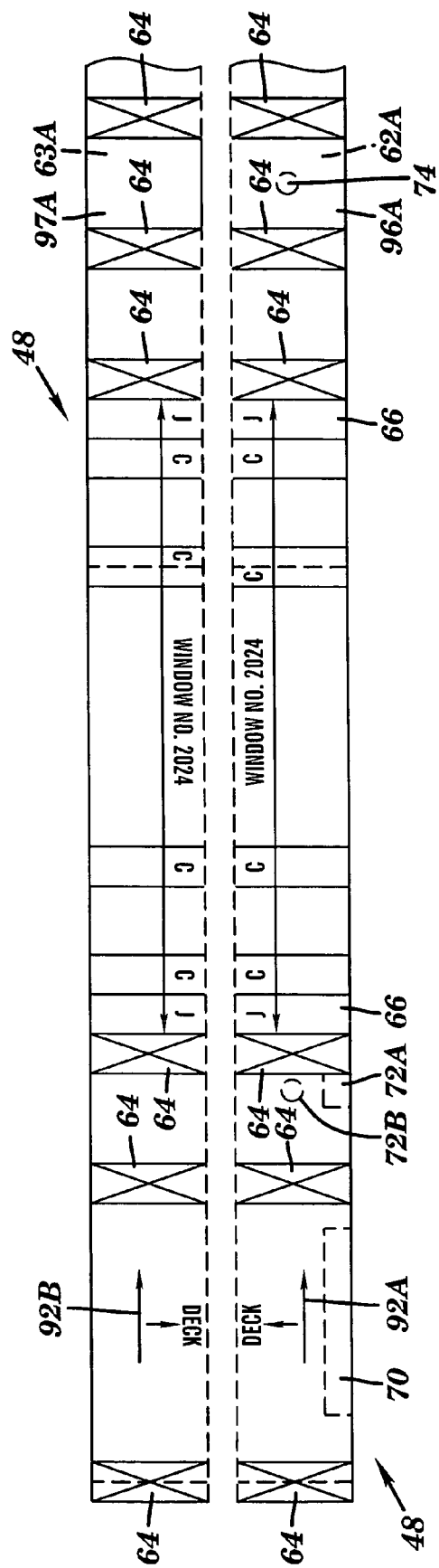
FIG. 6 illustrates a plan view of the banner separated into a first banner portion and a second banner portion.

Cutting along the cut line 94 of the banner 48 separates the first reference component 62A from the second reference component 63A (FIG. 6). Thus, the banner 48 is separated into a first banner portion 96A and a second banner portion 97A. The first banner portion 96A remains attached to the first reference component 62A, and the second banner portion 97A remains attached to the second reference component 63A. The first reference component 62A forms the bottom plate of the structure 32. The second reference component 63A forms the top plate of the structure 32. The markings 50 include a direction arrow 92A printed on the first banner portion 96A, and a direction arrow 92B printed on the second banner portion 97A. The direction arrows 92A and 92B are kept pointing in the same direction when the first reference component 62A and the second reference component 63A are placed into position as bottom 98 and the top 100 of the structure 32.

A plurality of studs 102 are cut to the appropriate selected length and are located and attached to the first reference component 62A and the second reference, component 63A at the stud location 64 markings 50 (FIG. 7). The jacks 80, the cripples 82, the sill 84, the headers 86, and the header sill 87 are cut to the lengths as indicated on the printed list 88 on the banner 48 (FIG. 3). The jacks 80 are located and attached to the first reference component 62A as indicated by the jack location 66 markings 50. The cripples 82 are located and attached to the first reference component 62A as indicated by the cripple location 68 markings 50. The sill 84 is attached to the cripples 82 and jacks 80. The header sill 87 is attached to the jacks 80. The headers 86 are attached to the studs 102 and the second reference component 63A. The jacks 80, the sill 84 and the header sill 87 form a window opening 104.

FIG. 7 illustrates a heating, ventilation, and air conditioning element 40F positioned at the marking 50 location 70. The heating, ventilation, and air conditioning element 40F may be any component (e.g., supply duct, return duct, etc.). The electrical element 400 is positioned at the 72A and 72B marking 50 locations. The electrical element 400 may be any electrical component (e.g., outlet, wire, switch, etc.). The plumbing element 40E is positioned at the marking 50 location 74. The plumbing element 40E may be any plumbing component (e.g., cold water pipe" hot water pipe, drain pipe, etc.).

Figure 8:
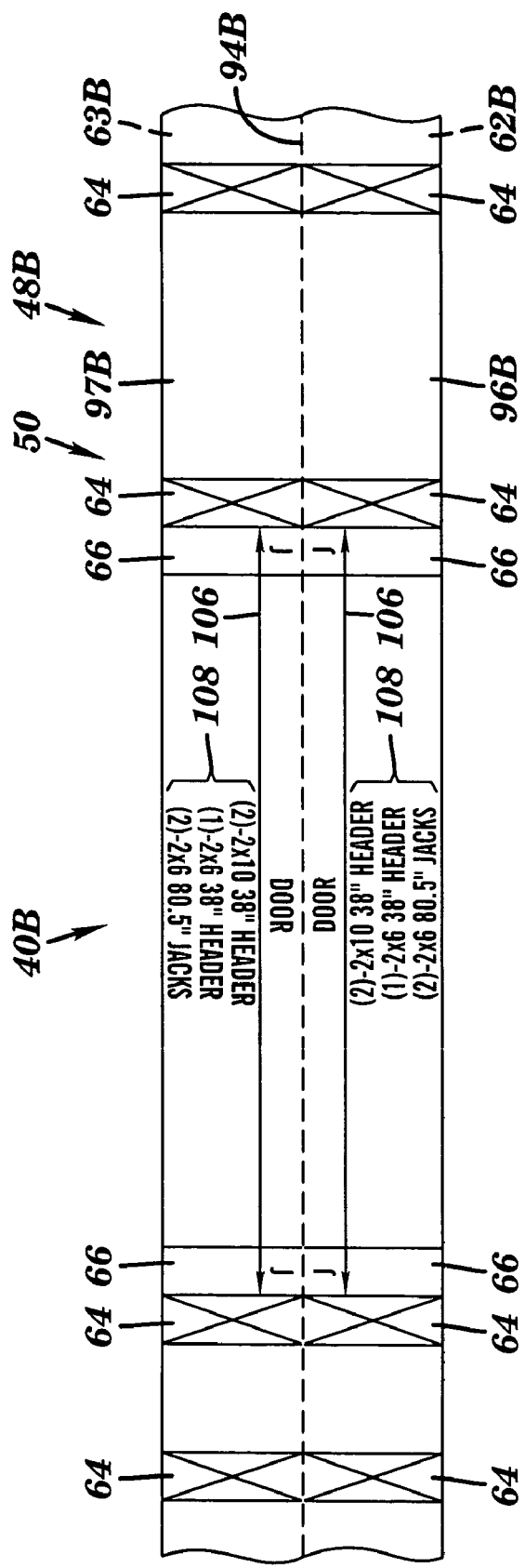
FIG. 8 illustrates another embodiment of a banner including a door opening.

FIG. 8 illustrates another embodiment of a banner 48B. The banner 48B includes markings 50 for stud locations 64 and a plurality of jack locations 66. Marking 50 includes lines 106 for identifying the location for the door 40C. The lengths and the number of structural members 40B including a plurality of jacks 80B, a plurality of headers 86B, and a header sill 87a are printed 108 on the banner 48B. The banner 48B is attached to a first reference component 62B and a second reference component 63B. The markings 50 include a cut line 94B that is cut by the knife.

Figure 9:
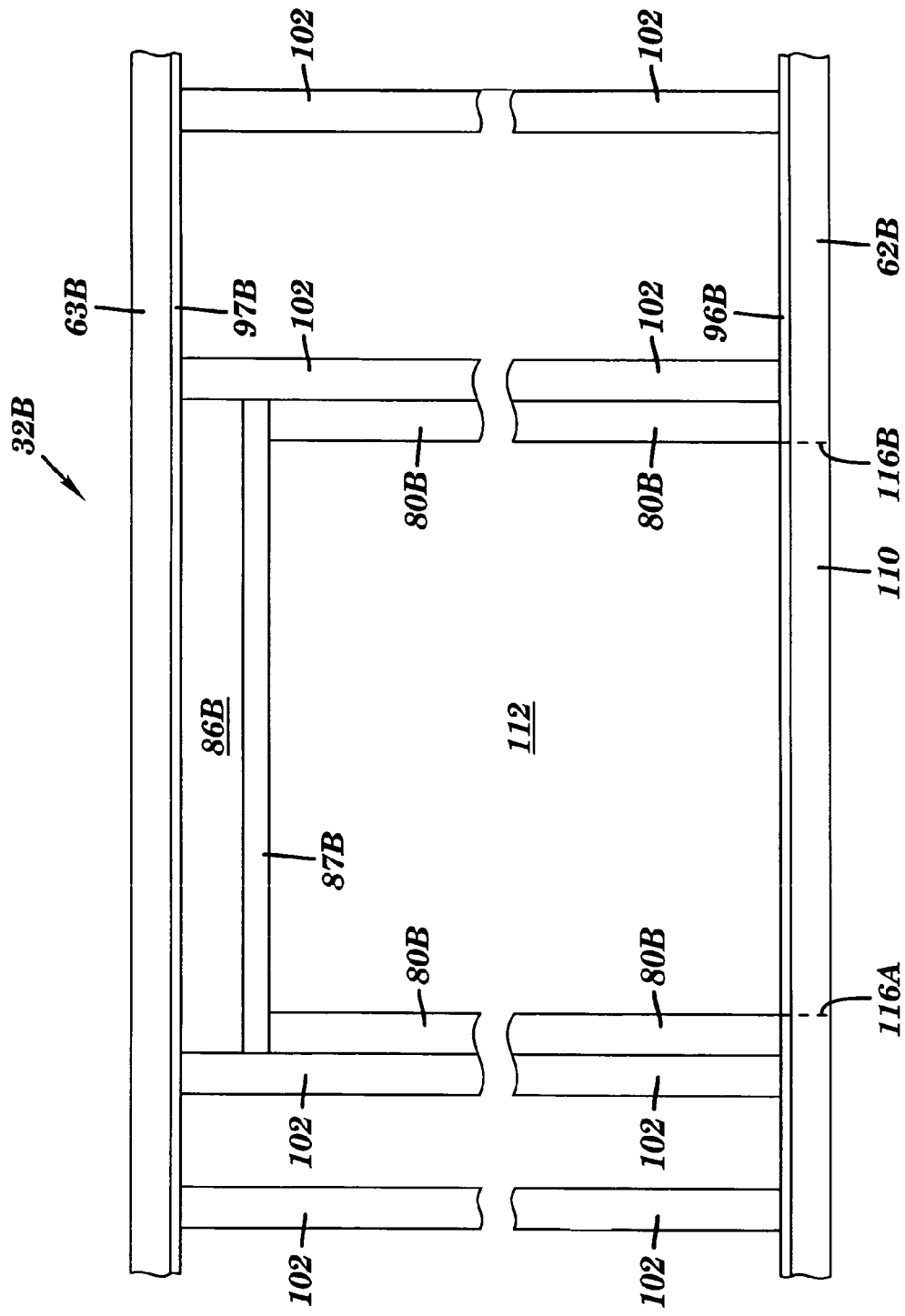
FIG. 9 illustrates a side view of a framed wall of a structure including the door opening.

Similar to the banner 48, cutting along the cut line 94B of banner 48B separates the first reference component 62B from the second reference component 63B. The banner 48B is separated into a first banner portion 96B and a second banner portion 97B. The first banner portion 96B remains attached to the first reference component 62B, and the second banner portion 97B remains attached to the second reference component 63B. The first reference component 62B is a bottom plate of the structure 32B and the second reference component 638 is a top plate of the structure 32B as illustrated in FIG. 9.

A plurality of studs 102 are cut to a uniform selected length and are located and attached to the first reference component 62B and the second reference component 63B at stud location 64 markings 50. The jacks 80B, the header sill 87B, and the headers 86B are cut to the lengths as indicated on the printed list 108 on the banner 48B (FIG. 8). The jacks 80B are located and attached to the first reference component 62B as indicated by the jack location 66 markings 50. The header sill 87B is attached to the jacks 80B. The headers 86B are attached to the studs 102 and the second reference component 63B. After the structure 32B is erected, cuts 116A and 116B are made through the first reference component 62B. Then a portion 110 of the first reference component 62B is removed from the door opening 112.

Figure 10:
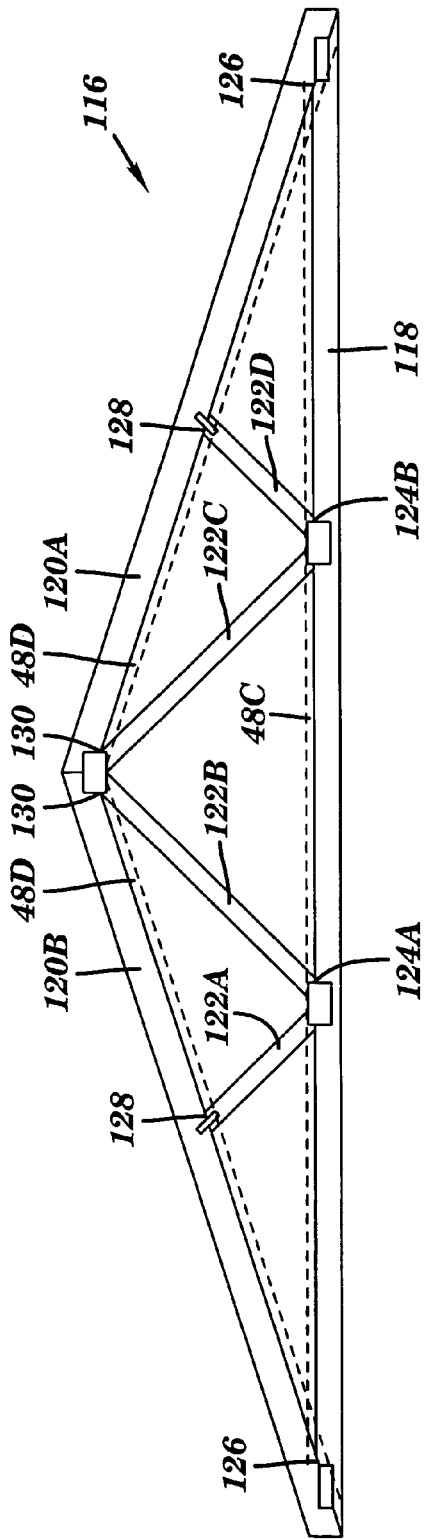
FIG. 10 illustrates a side view of a roof truss.
Figure 11:
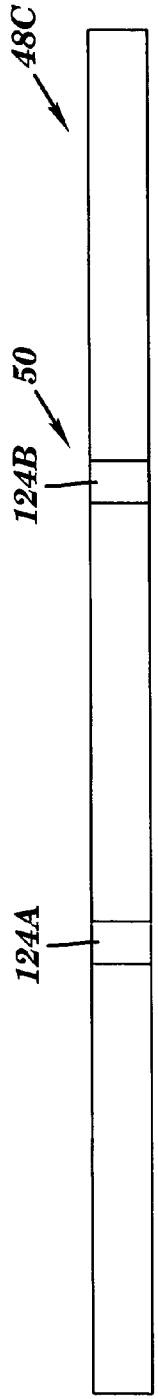
FIG. 11 illustrates another embodiment of a banner for a bottom chord of the roof truss.

FIG. 10 illustrates a side view of a roof truss assembly 116. The roof truss assembly includes a bottom chord 118, a top chord 120A, a top chord 120B, and a plurality of web members 122A-1220. FIG. 11 illustrates a banner 4~C that attaches to a bottom chord 118 of the roof truss assembly 116. The banner 48C is attached to the bottom chord 118 and is used to locate the web members 122A and 122B at the location 124A, and the web members 122C and 1220 at the location 124B.

Figure 12:
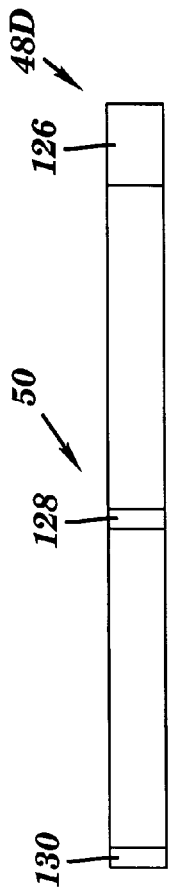
FIG. 12 illustrates a banner for a top chord of a the roof truss.

As illustrated in FIG. 12, a banner 480 includes markings 50 for a location 126, a location 128, and a location 130. A first copy of the banner 480 is attached to the top chord 120A, and a second copy of the banner 480 is attached to the top chord 120B. For the top chord 120A, the location 126 positions the top chord 120B with the bottom chord 118, the location 128 positions the top chord 120A with the web member 1220, and the location 130 positions the top chord 120A with the web member 122C. For the top chord 120B, the location 126 positions the top chord 120B with bottom chord 118, the location 128 positions the top chord 120B with the web member 122A, and the location 130 positions the top chord 120B with the web member 122B.

Figure 13:
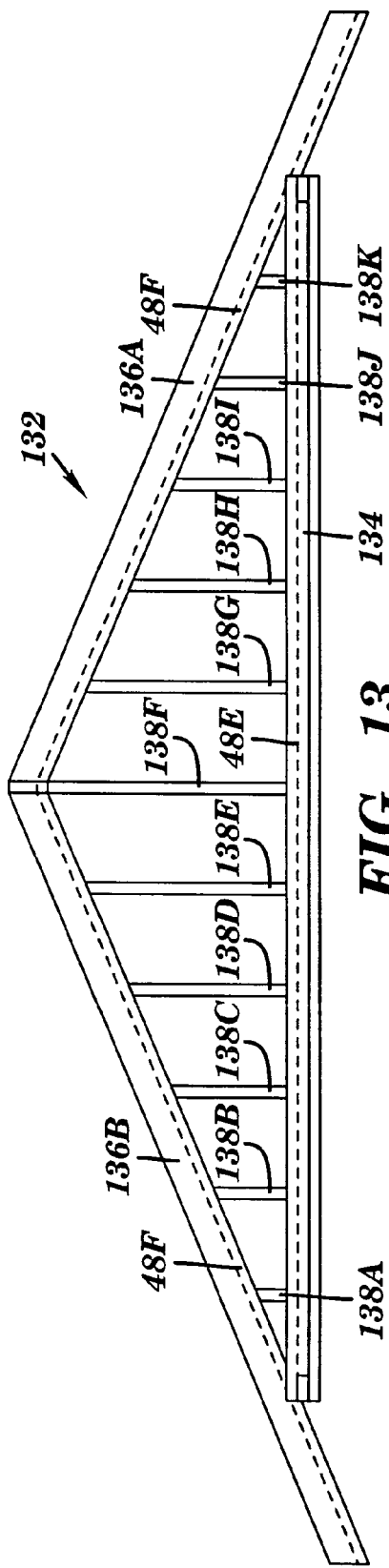
FIG. 13 illustrates a side view of a gable end.
Figure 14:
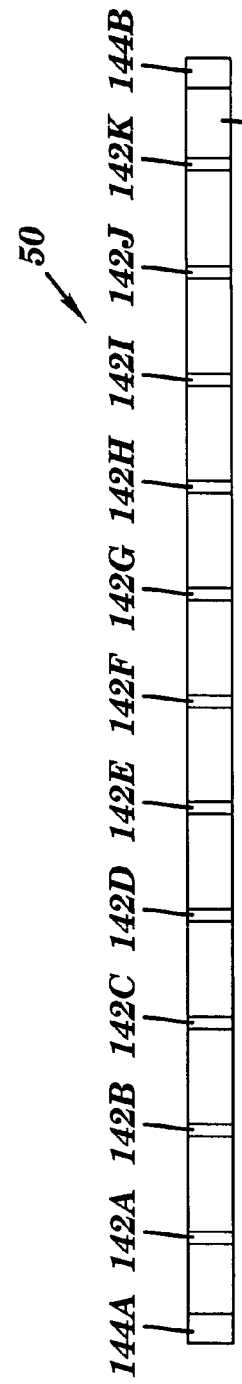
FIG. 14 Illustrates a plan view of a banner for a plate member of the gable end.
Figure 15:
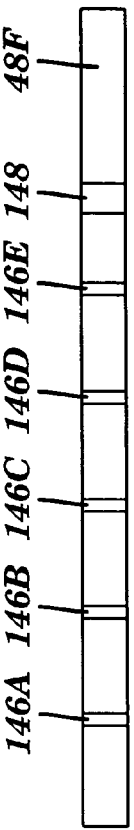
FIG. 15 illustrates a plan view of a banner for a gable rafter.

FIG. 13 illustrates a side view of a gable end 132. The gable end 132 includes a bottom plate 134, a rafter 136A and a rafter 136B, and a plurality of studs 138A-138K. A banner 48E is illustrated in FIG. 14. The banner 48E includes location 142A-142K markings 50 corresponding to the locations for the studs 138A-138K. A location 144A marking 50 and a location 144B marking 50 corresponds to the position of the rafter 136A and the rafter 136B. The banner 48E is attached to the base plate 134. A banner 48F is illustrated in FIG. 15. The banner 48 F includes location 146A-146E and location 148 markings 50. A first copy of the banner 48F is attached to the rafter 136A and a second copy of the banner 48F is attached to the rafter 136B. The markings on the banner 48F on rafter 136A locate the studs 138G-138K and the base plate 134. The markings on the banner 48F on rafter 136B locate the studs 138A-138E and the base plate 134.

Figure 16:
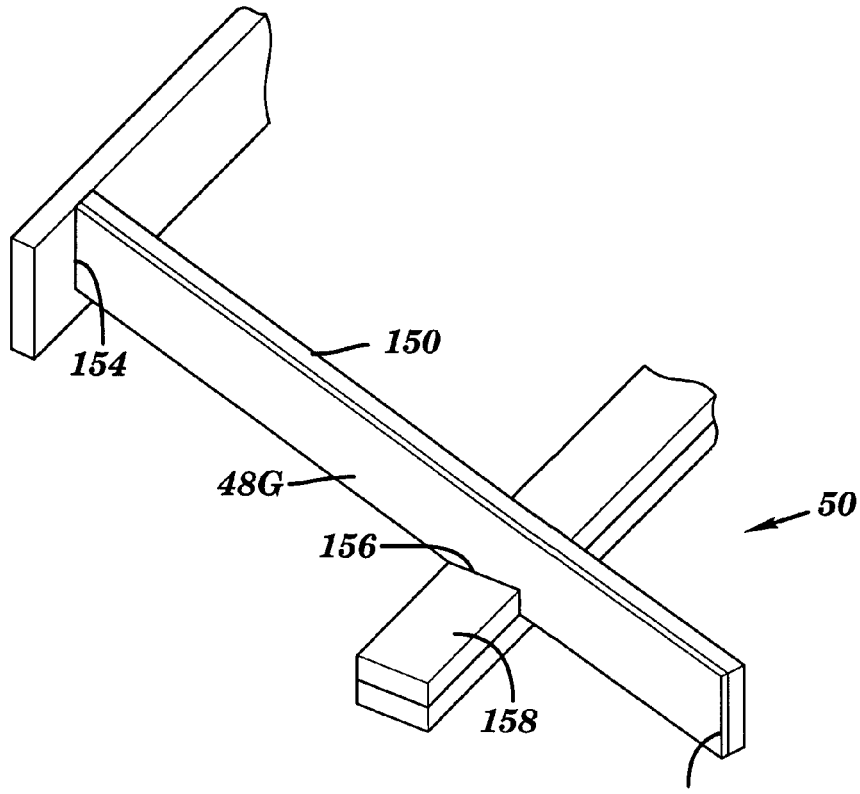
FIG. 16 illustrates a perspective view of a rafter member of the structure.
Figure 20:
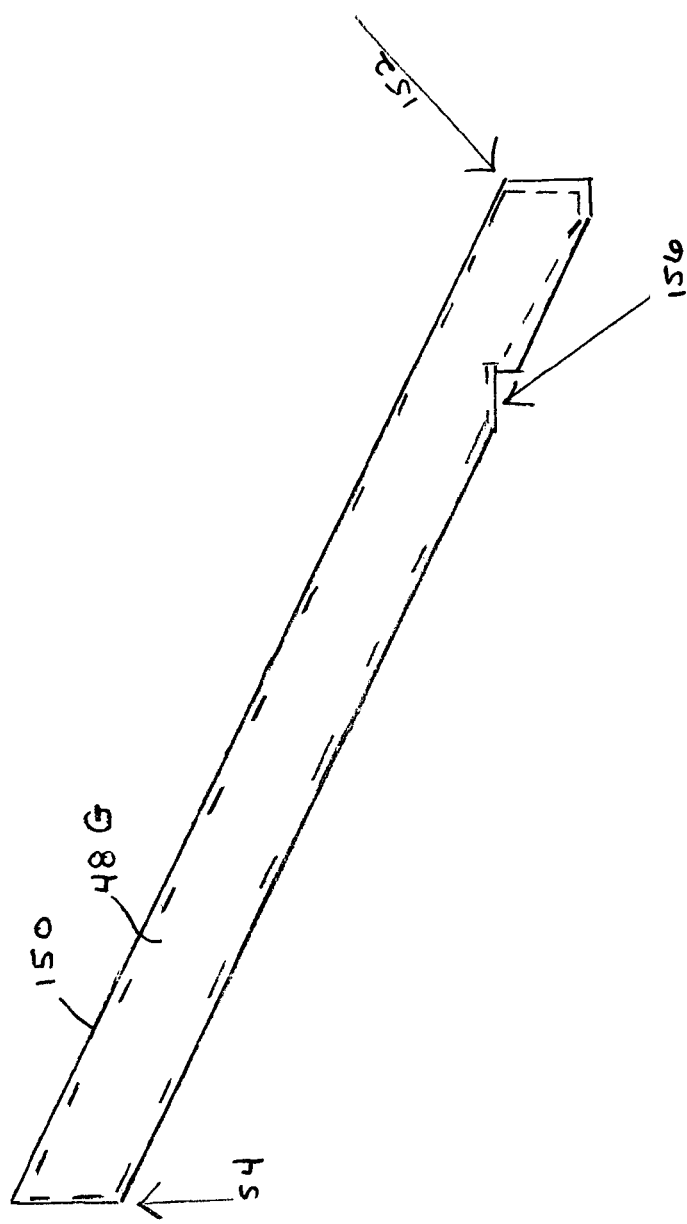
FIG. 20 illustrates a banner for a rafter member.

FIG. 16 illustrates a perspective view of a rafter member 150. A banner 48G is attached to the rafter member 150. The banner 48G, as illustrated in FIG. 20, provides a full size template so that the rafter member 150 has been cut to conform to the banner 48G shape. The banner 48G includes markings 50 for an over hang detail or end cut 152, a plumb angle or end cut 154, and a "bird's mouth" cut 156. The "bird's mouth" cut 156 allows the rafter member 150 to accept a double top plate 158.

Figure 17:
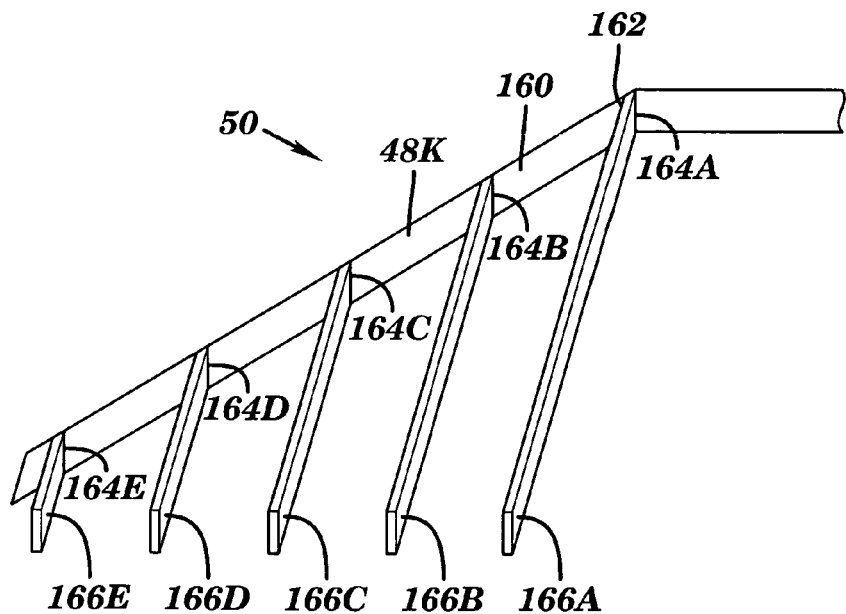
FIG. 17 illustrates a perspective view of a hip rafter member of the structure.

FIG. 17 illustrates a perspective view of a hip rafter member 160. A banner 48K is attached to the hip rafter member 160. The banner 48K provides a full size template so that the hip rafter member 160 has been cut to conform to the banner 48K shape. The banner 48K includes markings 50 for an end cut 162, and for a plurality of locations 164A-164E. The plurality of locations 164A-164E position a plurality of hip jack rafters 166A-166E, respectively.

Figure 18:
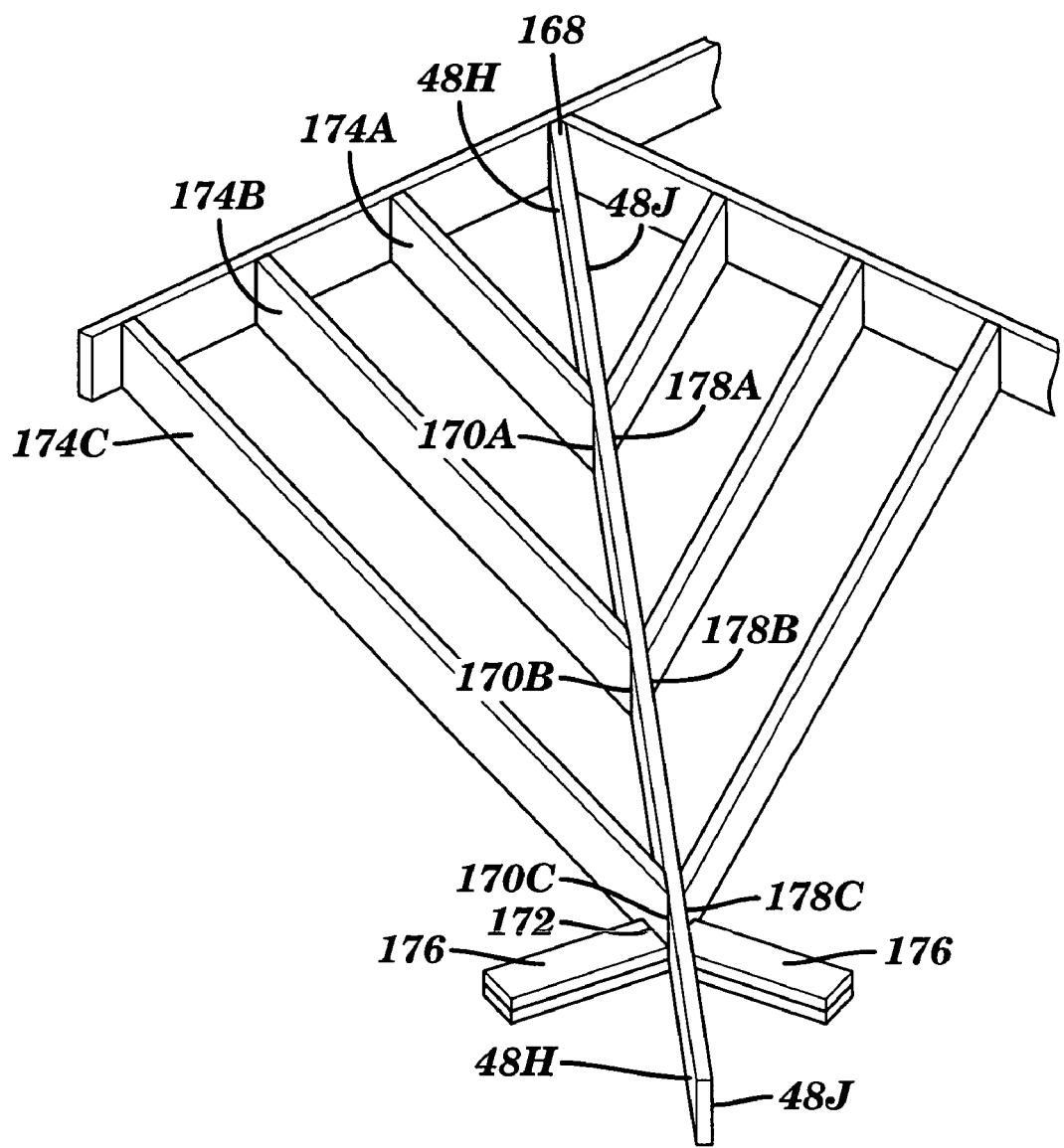
FIG. 18 illustrates a perspective view of a valley rafter member of the structure.

FIG. 18 illustrates a perspective view of a valley rafter member 168. A banner 48H and a banner 48J are attached to the rafter member 168. The banner 48H and the banner 48J provide full size templates onto the rafter member 168 and the rafter member 168 has been cut to conform to the shapes of the banner 48H and the banner 48J. The banner 48H includes markings 50 for a plurality of locations 170A-170C, and for a "bird's mouth cut" 172. The plurality of locations 170A-170C position the valley jack rafters 174A-174C. The "bird's mouth cut" 172 accepts the double top plate 176. The banner 48J includes markings 50 for a plurality of locations 178A-178C, and for the "bird's mouth cut" 172. The plurality of locations 178A-178C position a plurality of valley jack rafters 180A-180C.

Figure 19:
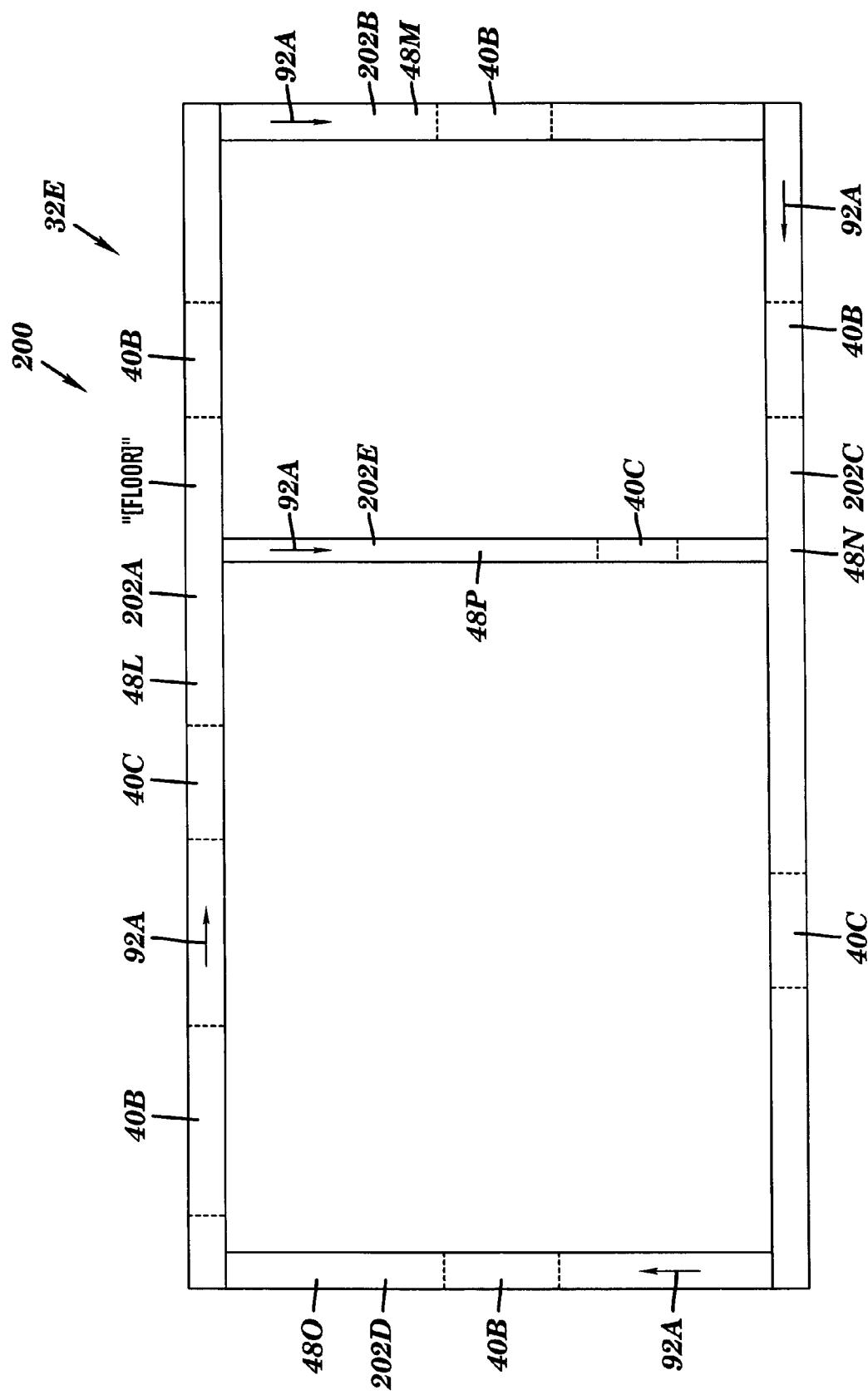
FIG. 19 illustrates a schematic plan view for a builder to determine the locations for each banner.

FIG. 19 illustrates a schematic plan view 200 of a structure 32E such as a building. The printing system 18 (FIG. 2) prints the schematic plan view 200. The schematic plan view 200 includes a plurality of banner locations 202A-202E. Each banner 48L-48P includes a unique banner number that is printed onto each banner 48L-48P and onto the schematic plan view 200. For example, if the banner 48L at location 202A is given a number "1floor1", then "1floor1" is printed onto the banner 48L and also onto the schematic plan view 200. A builder uses the schematic plan view 200 to determine the locations for each banner 48L-48P. The direction arrow 92A (FIG. 3) is printed on each banner 48L-48P. Additionally, the direction arrow 92A is printed onto the schematic plan view 200 for each banner location 202A-220E. The direction arrow 92A allows a builder to position each banner 48L-48P in a proper orientation. Additionally, locations for components 40 such as windows 40B and doors 40C are printed on the schematic plan view 200.

Figure 21:
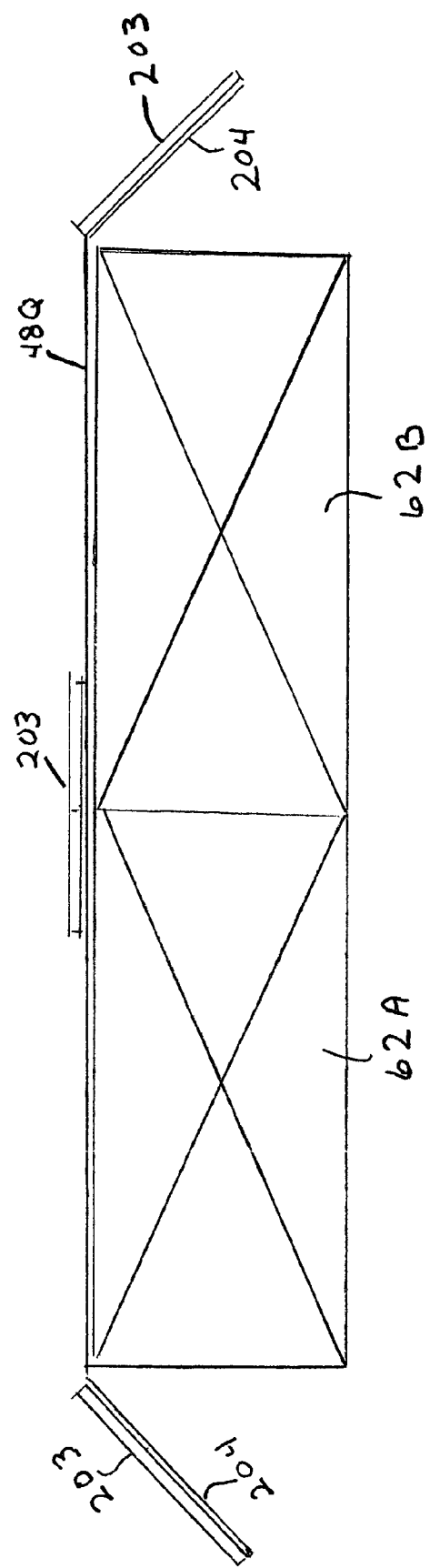
FIG. 21 illustrates the application of a gasket to the banner of the present invention.

It may be advantageous to add a gasket to edges of a banner substrate to form a continuous weatherproofing gasket barrier when the banner is attached to a framing element of a building structure. As illustrated in the end view of FIG. 21, a banner 48Q may overlay a first surface of a pair of reference components 62A and 62B, and a gasket 203 may be affixed to an overhanging portion 204 of the banner substrate. The overhanging portion 204 can then be attached to a side or end surface of the reference component. Gasket 203 may comprise foam or any other suitable weatherproofing gasket material. The gasket material may be affixed, for example, with adhesive, to the overhanging portion of the oversized banner 48Q after the banner has been printed by the printer. Gasket 203 could also be applied to the split or cut middle of the banner to address the other lateral side surface of an individual reference component.

Figure 22:
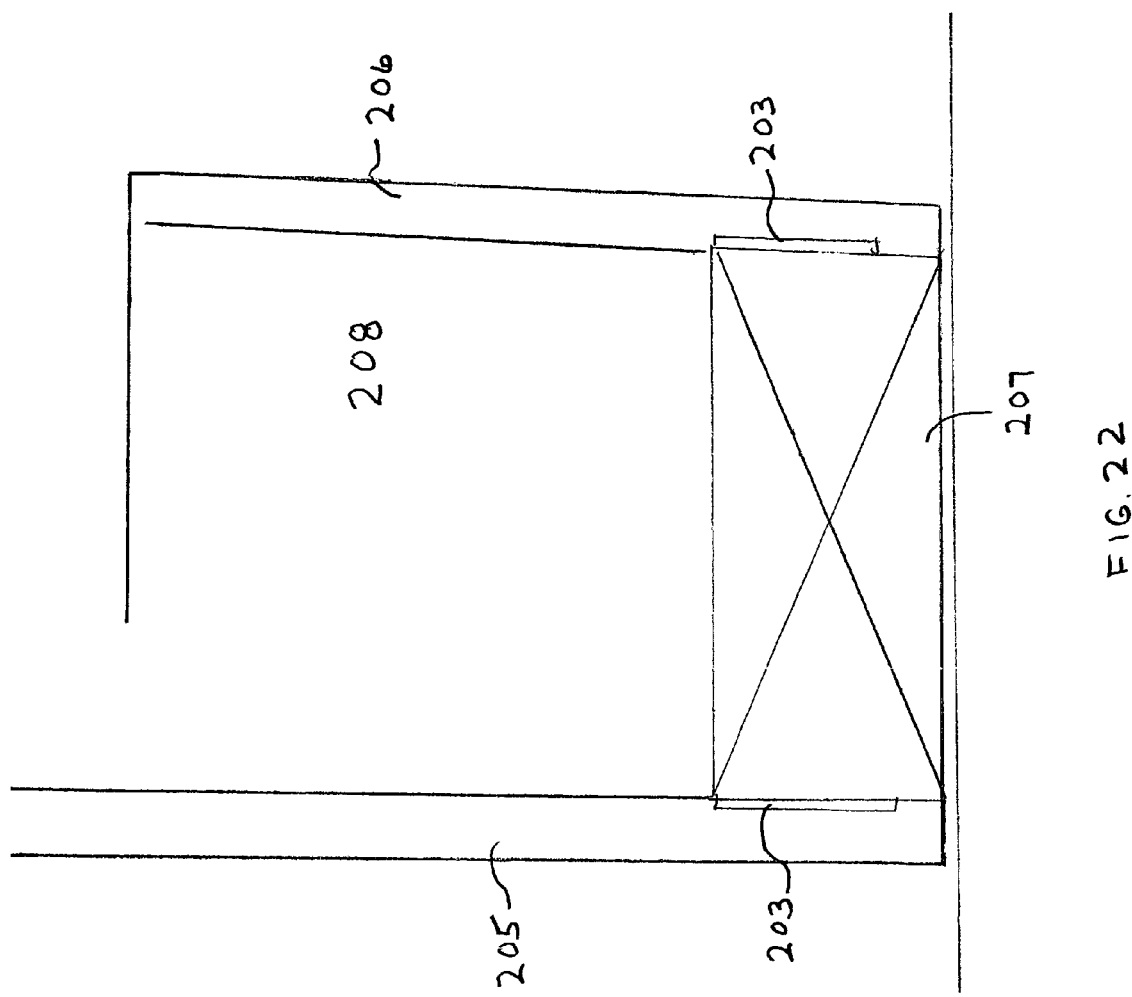
FIG. 22 is a side view illustrating the use of a banner with a gasket on a framing element.

As shown in FIG. 22, gasket 203 is especially useful where plywood or other sheathing 205 on the outside of a wall and sheetrock material 206 on the inside come in contact with a framing element 207 having gasket 203 on its two side surfaces. This occurs throughout the total lineal perimeter of the building structure. Eventually, the wall cavity between sheathing 205 and sheetrock 206 will be filled with insulation. The gasket 203 on the sides of framing element 207 serves to eliminate wind infiltration into insulation cavity 208 thus allowing the manufacturer's insulation to perform at its highest performance rating. Alternatively the oversized banner could be made entirely from printable gasket material.

FIG. 23 illustrates a generic banner 210 of the present invention. This generic banner can be printed by the printer of the present invention or provided as a preprinted banner by a banner manufacturer.

A first side 212 of banner 210 is provided with uniformly spaced markings including stud location markings 214, wallboard markings 216, directional markings 218, e.g. arrows, and junction set back markings 220. The junction set back markings are used when framing elements abut orthogonally. For 2"×4" studs, banner 210 may have a width of 7" with the set back marking 220 located 3 ½" from a remote end of an adjacent stud location marking 216. For a 2×6 stud system, the banner width might be 11" with a corresponding set back marking distance of 5½". The latter system is illustrated in FIG. 24 and may be marked on a reverse side 222 of banner 210. Double-sided printed banner 210 can thus be used with either 2×4 or 2×6 stud systems. As is well known in the 2×4 system, studs are located 16" on center on side 212; on reverse side 222, the 2×6 stud system would use 24" on center locations. Other stud placement locations are, of course, also possible. Instead of printing on two sides of a banner, markings for different stud size systems may be provided on the same side of a banner and distinguished by use of different colors or other differentiating features. Different banners for different stud size and spacing systems may also be provided.

The foregoing description of the present invention has been presented for purposes of illustration and description. It is not intended to be exhaustive or to limit the invention to the precise form disclosed, and many modifications and variations are possible in light of the above teaching. For example, the automated layout system 10 may be used to create banners 48 for any suitable structure (e.g., a residential building, a commercial building, a warehouse, a boat, etc.). Such modifications and variations that may be apparent to a person skilled in the art are intended to be included within the scope of this invention as defined by the accompanying claims.

The invention claimed is:

1. An apparatus comprising:
   an input system for acquiring an architectural design of a structure, the design including an identification of a first component of the structure;
   a processing system for converting the architectural design into a plurality of component locations of the structure; and
   an output system for receiving at least one component location from the processing system and for outputting each component location as markings on a banner, the banner being sized to overlay a first surface of an elongated framing element of the structure, the elongated framing element having a rectangular cross-section defined by said first surface, an opposite surface and two narrower side surfaces.

2. The apparatus of claim 1, wherein said identification comprises at least one of:
   (a) a vendor part number for said first component, and
   (b) dimensional measurements of said first component.

3. The apparatus of claim 2, wherein said first component comprises a door or a window, and said measurements comprise rough opening dimensional measurements of the door or window.

4. The apparatus of claim 2, wherein said processing system determines dimensions of said first component by using said vendor part number to access a data base of vendor part specifications.

5. An apparatus comprising:
   an input system for acquiring an architectural design of a structure, the architectural design including a job site location metric;
   a processing system for converting the architectural design into a plurality of component locations of the structure, and for determining particular region engineering specifications for the structure by using said metric to access a data base of such specifications; and
   an output system for receiving at least one component location from the processing system and for outputting each component location as markings on a banner, the banner being sized to overlay a first surface of an elongated framing element of the structure, the elongated framing element having a rectangular cross-section defined by said first surface, an opposite surface and two narrower side surfaces.

6. An apparatus comprising:
   an input system for acquiring an architectural design of a structure, the structure comprising at least one of a roof truss assembly, a gable end and a rafter assembly;
   a processing system for converting the architectural design into a plurality of component locations of the structure; and
   an output system for receiving at least one component location from the processing system and for outputting each component location as markings on a banner, the banner being sized to overlay a first surface of an elongated framing element of the structure, the elongated framing element having a rectangular cross-section defined by said first surface, an opposite surface and two narrower side surfaces.

7. The apparatus of claim 6 wherein said structure comprises a roof truss assembly, and said framing element comprises at least one of a top chord and a bottom chord.

8. The apparatus of claim 6, wherein the structure comprises a gable end, and the framing element comprises at least one of a rafter and a bottom plate.

9. The apparatus of claim 6, wherein the structure comprises a rafter assembly, the framing element comprises a rafter member, and said at least one component location comprises a location of at least one of (a) an end cut, (b) a bird's mouth cut, (c) a hip jack rafter and (d) a valley jack rafter.

10. A method comprising the steps of:
   providing an architectural design of a framing structure;
   with a computer-aided design system, generating a digitized data file from the architectural design;

with a processing system, converting the digitized data file into a plurality of component locations of the structure;
marking the location for at least one component of said plurality of component locations onto at least one banner, the banner being sized to overlay a first surface of an elongated reference component of the framing structure, the reference component having a rectangular cross section defined by the first surface, an opposite surface and a pair of narrower side surfaces; and
applying a gasket to said banner.

11. The method of claim 10, wherein said banner is oversized so that a portion of the banner extends beyond said first surface, and the gasket is affixed to said portion.

12. The method of claim 11, further comprising attaching the banner onto the first surface of the reference component such that the banner portion and gasket overlie at least a portion of a side or end surface of the reference component.

13. The method of claim 12, further comprising attaching the banner portion to said side or end surface of the reference component.

14. A banner sized to overlay an elongated framing element of a building structure, comprising:
an elongated sheet of material; and
a plurality of uniformly spaced markings on the elongated sheet of material for indicating a location for at least one component of said structure, said markings including junction set back markings.

15. The banner of claim 14, wherein said markings include stud location markings and at least one of: wall board location markings and directional markings.

16. A banner sized to overlay an elongated framing element of a building structure, comprising:
an elongated sheet of material; and
a plurality of markings on the elongated sheet of material for indicating a location for at least one component of said structure, and wherein said structure comprises at least one of: a roof trust assembly, a gable end, and a rafter assembly.

17. The banner of claim 16, wherein said framing element comprises a rafter member, and said markings include markings indicating a location of at least one of: (a) an end cut, (b) a bird's mouth cut, (c) a hip jack rafter and (d) a valley jack rafter.

18. A banner sized to overlay an elongated framing element of a building structure, comprising:
an elongated sheet of material;
a plurality of markings on the elongated sheet of material for indicating a location for at least one component of said structure; and
a weatherproofing gasket affixed to the sheet of material.

19. The banner of claim 18, wherein the elongated framing element has a rectangular cross section defined by a first surface, a second surface opposite said first surface, and a pair of narrower side surfaces, and the banner is sized to overlay the first surface with a portion of said banner extending beyond said first surface, and the gasket is affixed to said banner portion.

20. A banner sized to overlay a first surface of an elongated framing element of a building structure, the elongated framing element having a rectangular cross section defined by said first surface, an opposite surface and two narrower side surfaces, the banner comprising:
an elongated sheet of weatherproofing gasket material;
a plurality of markings on the elongated sheet of material for indicating a location for at least one component of said structure; and
wherein the elongated sheet of material extends beyond said first surface.

* * * * *